(12) United States Patent
Tsai et al.

(10) Patent No.: US 6,274,918 B1
(45) Date of Patent: Aug. 14, 2001

(54) INTEGRATED CIRCUIT DIODE, AND METHOD FOR FABRICATING SAME

(75) Inventors: Chin-Yu Tsai, Plano; Taylor R. Efland, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/252,171

(22) Filed: Feb. 18, 1999

Related U.S. Application Data

(60) Provisional application No. 60/075,277, filed on Feb. 19, 1998.

(51) Int. Cl.[7] ................................................. H01L 23/58
(52) U.S. Cl. ........................... 257/492; 257/491; 257/605
(58) Field of Search ................................ 257/106, 491, 257/492, 603, 605; 438/91, 380, 983

(56) References Cited

U.S. PATENT DOCUMENTS

| | | | |
|---|---|---|---|
| 4,602,266 | 7/1986 | Coe | 257/495 |
| 4,713,681 | * 12/1987 | Beasom | 257/336 |
| 5,077,590 | * 12/1991 | Fujihara | 257/491 |
| 5,241,210 | 8/1993 | Nakagawa et al. | 257/487 |
| 5,276,350 | * 1/1994 | Merrill et al. | 257/603 |
| 5,294,825 | * 3/1994 | Nakagawa et al. | 257/487 |
| 5,861,657 | * 1/1999 | Ranjan | 257/492 |
| 5,869,882 | * 2/1999 | Chen et al. | 257/605 |
| 6,002,158 | 12/1999 | Yanagigawa | 257/492 |
| 6,100,572 | * 8/2000 | Kinzer | 257/492 |

OTHER PUBLICATIONS

J.A. Appels and H.M.J. Vaes, "High Voltage Thin Layer Devices (Resurf Devices)", pp. 238–241, 1979.

* cited by examiner

*Primary Examiner*—Eddie Lee
*Assistant Examiner*—George C. Eckert, II
(74) *Attorney, Agent, or Firm*—Wade James Brady, III; Frederick J. Telecky, Jr.

(57) ABSTRACT

An integrated circuit (10) includes a P-epi substrate (12) having therein an n-well isolation layer (13) and a p-well (14) within the n-well. The p-well includes adjacent an upper surface thereof a p+ layer (18) having several elongate parallel openings (21–23) therethrough. Each of the openings has therein a respective n– RESURF layer (26–28). Each n– RESURF layer has therethrough a respective further elongate opening (31–33), and has a uniform horizontal thickness all around that opening. Each of the openings in the RESURF layers has therein an n+ finger (36–38). The p+ layer and the n+ fingers each have a vertical thickness which is greater than the vertical thickness of the n– RESURF layers. The p+ layer serves as the anode of a zener diode, and the n+ fingers are interconnected and serve as the cathode.

6 Claims, 2 Drawing Sheets

US 6,274,918 B1

INTEGRATED CIRCUIT DIODE, AND METHOD FOR FABRICATING SAME

This application claims priority under 35 USC § 119 (e)(1) of provisional application No. 60/075,277, filed Feb. 19, 1998.

TECHNICAL FIELD OF THE INVENTION

This invention relates in general to implementation of a zener diode in an integrated circuit and, more particularly, to an integrated circuit diode and a method of fabricating the diode so as to realize reduced power consumption and a higher breakdown voltage for a given integrated circuit area.

BACKGROUND OF THE INVENTION

One technique for implementing a zener diode in an integrated circuit involves the provision of spaced and alternating n+ and p+ regions in an n-well or p-well. A variation is to provide a p-base (shallow p-well) around the p+ regions in an n-well, or an n-base around the n+ regions in a p-well. The p+ regions are interconnected and serve as the anode, and the n+ regions are interconnected and serve as a cathode.

Where a particular application requires a zener diode with a specified breakdown voltage, a design criteria is to realize the specified breakdown voltage, while using the smallest possible area in the integrated circuit. Stated differently, for a given area of the integrated circuit, a design criteria is to implement a zener diode with the highest possible breakdown voltage.

A further design criteria is to decrease the power dissipated in the zener diode when it is forward biased. Since power is defined to be the product of voltage and current, there must be efficient current conductivity for a given forward bias voltage, which means reduced resistance to current flowing through the diode for a given voltage. Stated differently, it is desirable to achieve a lower operational voltage across the diode for a given current flow through the diode.

SUMMARY OF THE INVENTION

From the foregoing, it may be appreciated that a need has arisen for a method and apparatus for implementing an integrated circuit diode so as to achieve reduced power consumption, and so as to achieve an increased breakdown voltage for a given area of the integrated circuit. According to the present invention, a method and apparatus are provided to address this need, and involve: providing a semiconductor substrate having a portion which is made from a first type of semiconductor material; fabricating in the portion of the substrate a first region which is made from the first type of semiconductor material and is doped more heavily than the portion of the substrate; fabricating a second region which is disposed in the portion of the substrate, which is spaced from the first region, and which is made from a second type of semiconductor material different from the first type of semiconductor material, one of the first and second types of semiconductor material being a p-type material and the other thereof being an n-type material; and fabricating a RESURF region in the substrate between the first and second regions and in contact with the second region, the RESURF region being made of the second type of semiconductor material and being doped more lightly than second region.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
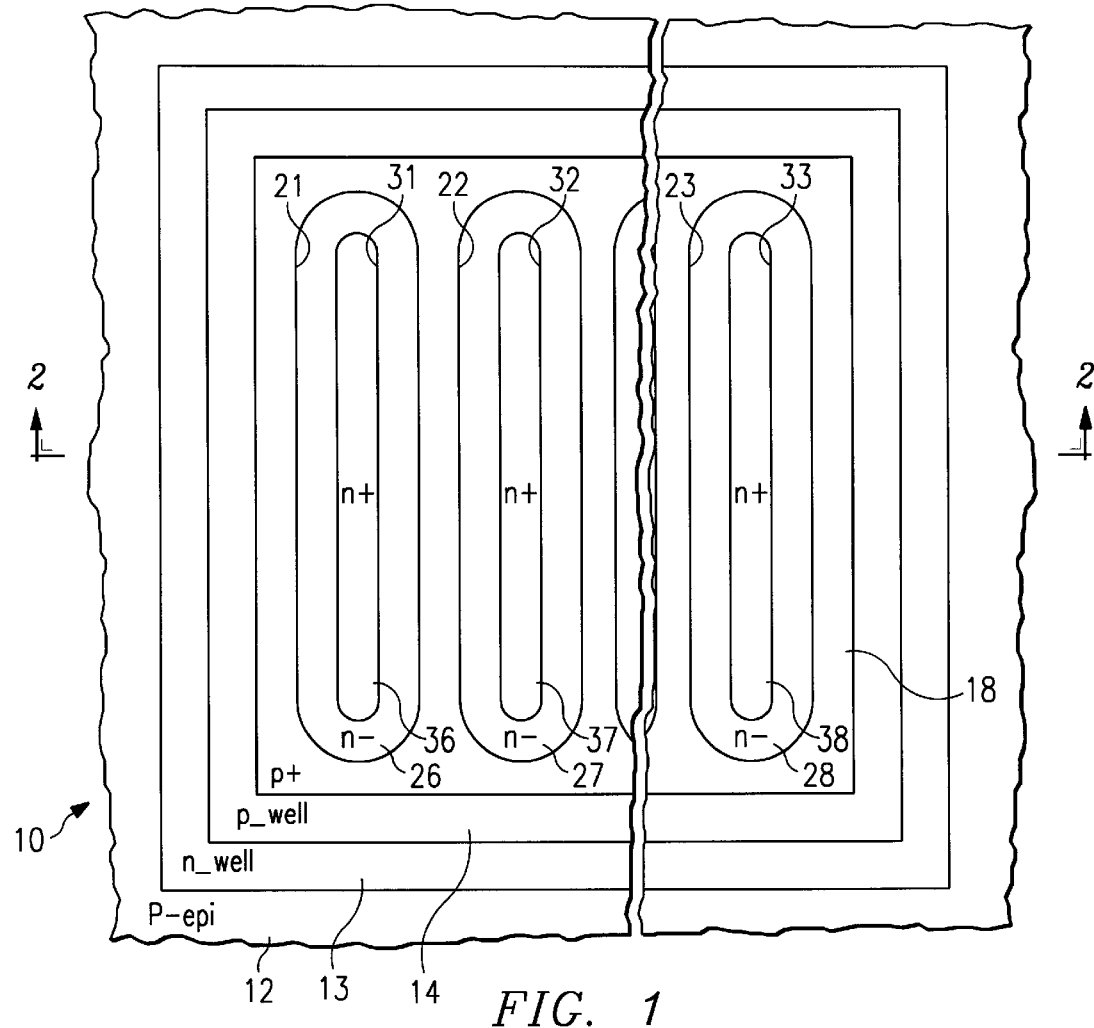
FIG. 1 is a diagrammatic top view of a portion of an integrated circuit which implements a zener diode according to the present invention.
Figure 2:
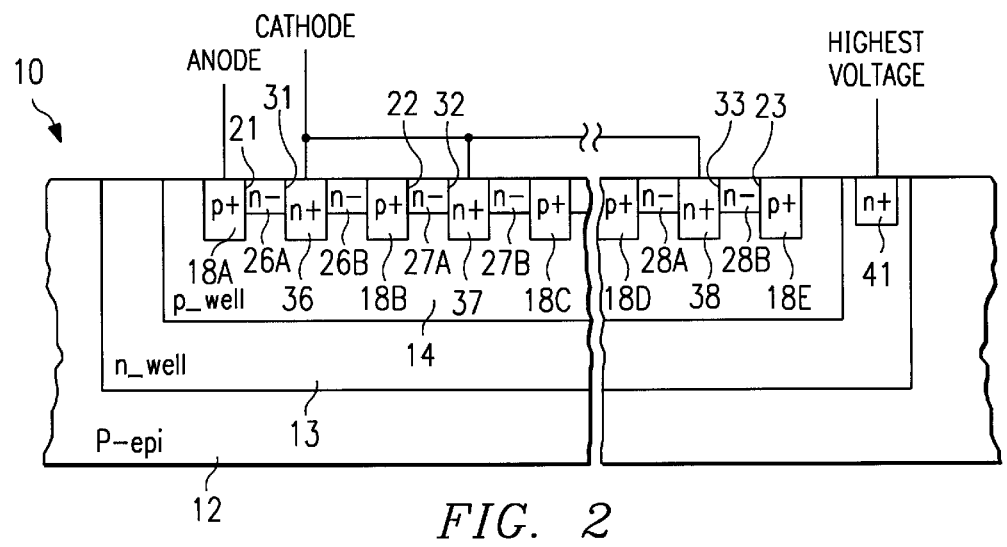
FIG. 2 is a diagrammatic sectional view taken along the line 2—2 in FIG. 1.

FIG. 1 is a diagrammatic top view of a portion of an integrated circuit 10 which implements a zener diode in accord with the present invention. FIG. 2 is a diagrammatic sectional side view of the same integrated circuit.

In the disclosed embodiment, the integrated circuit 10 is a Linear Bi-CMOS (LBC) device. The integrated circuit 10 includes a semiconductor substrate 12, which is a P-epi material. The substrate has therein an n-well 13, which in turn has a p-well 14 therein. The n-well 13 serves as an isolation layer, which electrically isolates the p-well 14 from other not-illustrated circuitry in the integrated circuit 10.

The p-well has therein at an upper side thereof a layer 18 of a p+ material. The p+ layer 18 has a plurality of horizontally elongated openings that each extend vertically through layer 18, three of which are shown at 21, 22 and 23. In the disclosed embodiment, there are approximately twenty to thirty such openings through the p+ layer 18. All of these openings extend parallel to each other, and each such opening is spaced by a uniform distance from each such opening which is adjacent thereto. Both ends of each opening are rounded.

Each of the openings 21–23 has therein a layer of an n– material, three of which are shown at 26–28 for the respective openings 21–23. The n– layers are each a RESURF (reduced surface field) layer, and each have a vertical thickness which is less than the vertical thickness of the p+ layer 18. Each of the n– layers has extending vertically therethrough an opening, three of which are shown at 31–33 for the respective n– layers 26–28. The openings 31–33 are elongated in a horizontal direction parallel to the openings 21–23, and have rounded ends. The n– layers 26–28 each have a horizontal thickness which is uniform all the way around the associated opening 31, 32 or 33.

Each of the openings in the n– layers has therein a finger of an n+ material, three of which are shown at 36–38. The fingers 36–38 each have rounded ends. Further, the fingers 36–38 each have a vertical thickness which is approximately the same as the vertical thickness of the p+ layer 18, and which is thus greater than the vertical thickness of the n– RESURF layers 26–28.

For convenience, and with reference to FIG. 2, finger-like portions of the p+ layer 18 which are disposed between the openings 21–23 are identified with respective reference characters 18A–18E in FIG. 2. Similarly, finger-like portions of the n– layers 26–28 which have the fingers 36–38 and the finger-like portions 18A–18E therebetween are identified in FIG. 2 with reference characters 26A–26B, 27A–27B, and 28A–28B.

The p-well 14, and the p+, n– and n+ regions therein, function as a zener diode. The p+ layer 18, which includes the portions 18A–18E, functions as the anode. The n+ fingers 36–38 are interconnected, and collectively function as the cathode. An n+ region 41 is provided in the n-well 13, at a location external to the p-well 14, and in a given application is coupled to a reference voltage which is at least as large as any operational voltage that might be applied to the anode or cathode in that application.

Figure 3:
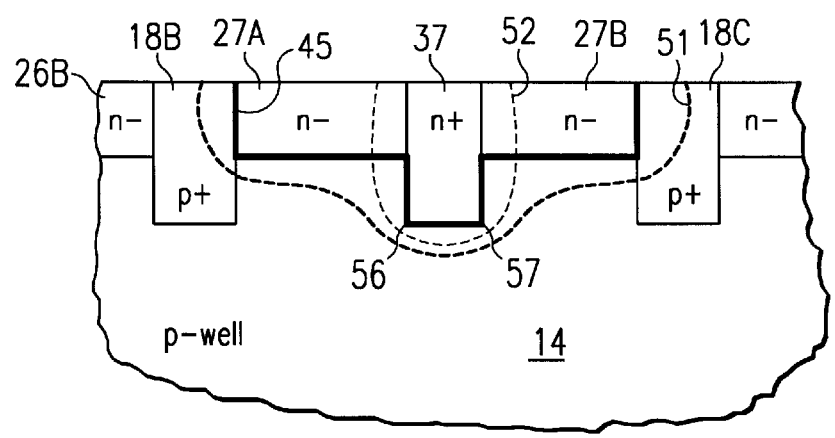
FIG. 3 is a diagrammatic sectional view which is an enlarged view of a portion of FIG. 2.

FIG. 3 is an enlarged view of a portion of FIG. 2, centered around the n+ finger 37. A bold line 45 designates one of the PN junctions of the zener diode, representing the boundary between the n-type material of n+ finger 37 and n− layer 27, and the p-type material of p+ layer 18 and p-well 14. The broken line 51 represents the RESURF field around the PN junction. Because the n− RESURF region 27 has a uniform horizontal thickness all around the finger 37, the distribution of the field 51 is very even. If the n− RESURF region 27A and 27B were not present, the PN junction would be defined by the boundary between n+ finger 37 and p-well 14, and the field around this PN junction would be as shown by the broken line at 52.

It is known that breakdown tends to occur first at the corners 56 and 57 of the finger 37, where the field 52 is thinnest and thus weakest. Due to the provision of the n− RESURF region 27, including portions 27A and 27B, the associated field 51 for the PN junction 45 is smoother and thicker in the region of the corners 56 and 57 than the field 52. As a consequence, for a given configuration and pitch of the n+ fingers 36–38, breakdown will occur at a higher voltage than would be the case without the n− RESURF region 27.

The RESURF field 51 also improves resistance to breakdown in the region of the p+ portions 18B and 18C. This is due in part to the fact that depletion regions extend horizontally into the n− portions 27A and 27B from the p+ portions 18B and 18C, and overlap with depletion regions which extend vertically upwardly into the n− portions 27A and 27B from their boundaries with the p-well region 14. The entire n− RESURF region 27 is depleted.

It will also be recognized that, due to the provision of the n− RESURF layer 27, the area of the PN junction 45 is substantially greater than the area of the PN junction which would be defined by the n+ finger 37 if the n− layer 27 were not present. Due to this larger junction area, more current can flow through the pn junction and thus through the diode for a given voltage across the diode. Stated differently, for a given current flow through the diode, the voltage across the diode will be less when the RESURF layer 27 is present than if it were not present.

Figure 4:
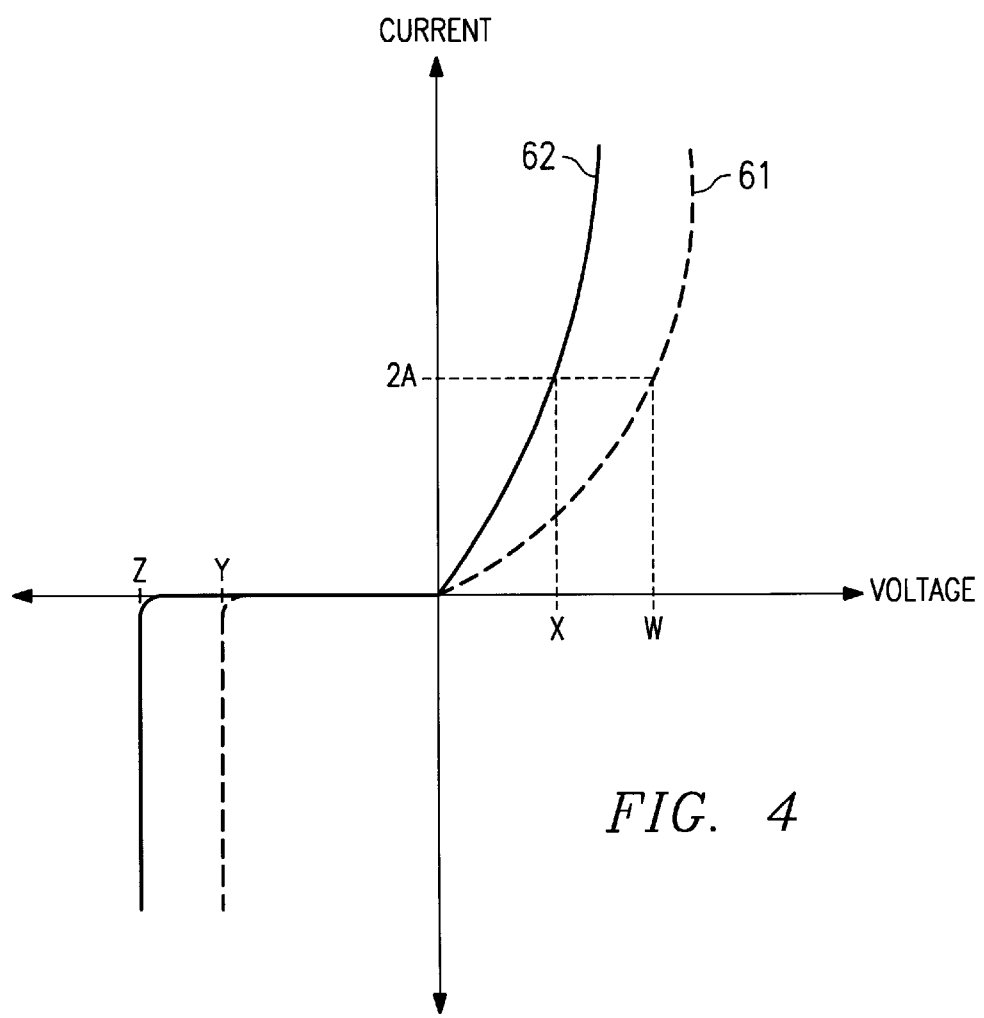
FIG. 4 is a graph showing an operational characteristic of the zener diode of FIG. 1.

This is shown in FIG. 4, which is a graph depicting the characteristic curve of the zener diode. More specifically, the broken-line curve 61 represents the characteristic which the zener diode of FIG. 2 would have if the n− RESURF layers 26–28 were omitted. For a current of two amperes, the voltage across the diode is W, and breakdown occurs at a reverse bias voltage Y. The solid-line curve 62 represents the characteristic of the zener diode of FIG. 2, which includes the n− RESURF layers 26–28. At a current of two amperes, the forward bias voltage across the diode is X, which is less than W. Further, breakdown occurs at a reverse bias voltage Z, which is a larger reverse bias voltage than the voltage Y.

Since power consumption is the product of current and voltage, it will be recognized that the power dissipation associated with the characteristic curve 62 for a current of two amperes is less than the power dissipation associated with the characteristic curve 61 for the same current, when the diode is forward biased. Further, for a given layout size of the diode in the integrated circuit, the effective reverse bias breakdown voltage has been increased from Y to Z.

The breakdown voltage also varies in proportion to the spacing between adjacent n+ and p+ regions. Thus, to the extent that providing the n− RESURF regions 26–28 increases the breakdown voltage from Y to Z, the spacing or pitch between adjacent n+ fingers 36–38 can be reduced in order to reduce the breakdown voltage from Z back down to Y. In other words, providing the n− RESURF regions 26–28 permits the breakdown voltage Y to be realized with a smaller finger pitch than would be possible without the RESURF regions, which in turn means that the breakdown voltage Y can be realized in a smaller integrated circuit area when the RESURF regions are present than when they are not.

For these reasons, where a particular application requires a zener diode with a specified breakdown voltage, the area which is required in an integrated circuit to implement the diode is smaller than if the n− RESURF layers were not present. More specifically, the number of fingers used to implement the diode may be reduced by about 20%, and in addition the pitch between these fingers may be reduced by about 10%.

One approach for fabricating the integrated circuit of FIGS. 1 and 2 is to create the n-well 13 and p-well 14 within the P-epi substrate 12. Then, a single n− layer is formed adjacent the top surface of the p-well 14. Portions of this single n− layer will eventually become the separate n− layers 26–28. More specifically, after forming the single n− layer, the n+ fingers 36–38 and the p+ layer 18 are formed in the material of the p-well 14 through diffusion. The doping of the n+ fingers 36–38 and the p+ layer 18 is two or three orders of magnitude higher than the doping of the single n− layer, and thus the doping for the n+ and the p+ regions effectively outdiffuses the n− material where the n+ and p+ regions are being formed.

The present invention provides significant technical advantages. One such technical advantage is that, for a given area used to implement a zener diode in an integrated circuit, a higher reverse bias breakdown voltage is realized, representing a higher performance efficiency for this integrated circuit area. A further advantage is that a lower power consumption is realized when the diode is forward biased.

Although one embodiment has been illustrated and described in detail, it should be understood that various changes, substitutions and alterations can be made therein without departing from the scope of the present invention. For example, although the disclosed zener diode is implemented with n+ fingers each surrounded by an n− RESURF layer within a p+ layer, there are variations of this configuration which are encompassed by the invention. As an example, the diode could have p+ fingers surrounded by a p− RESURF layer within an n+ layer. In addition, while the disclosed embodiment has n+ fingers which are elongate, the n+ fingers could have other shapes. It will be recognized that other changes, substitutions and alterations are also possible without departing from the spirit and scope of the present invention, as defined by the following claims.

What is claimed is:

1. An integrated circuit diode, comprising:
   a substrate having a portion which is made of a first type of semiconductor material;
   a first region which is disposed in said portion of said substrate and which is made from said first type of semiconductor material;
   a second region which is disposed in said portion of said substrate, which is spaced from said first region, and which is made from a second type of semiconductor material different from said first type of semiconductor material, said first type of semiconductor material being one of a p-type and an n-type semiconductor material, and said second type of semiconductor material being the other of a p-type and an n-type semiconductor material; and a RESURF region which is disposed in said substrate between said first and second regions, which is in contact with said second region, which is made from said second type of semiconductor material, and which is doped more lightly than said second region, wherein said RESURF region extends from said second region to said first region.

2. An integrated circuit diode according to claim 1, wherein said portion of said semiconductor substrate has a surface on one side thereof;

wherein said first and second regions and said RESURF region are all adjacent said surface; and wherein said first and second regions extend further into said portion of said substrate than said RESURF region in a direction away from said surface.

3. An integrated circuit diode according to claim 1, wherein said portion of said substrate is a p-type material;

wherein said first region is a p+ material;

wherein said second region is an n+ material; and wherein said RESURF region is an n− material.

4. An integrated circuit diode according to claim 1, wherein said portion of said substrate is an n-type material;

wherein said first region is n+ material;

wherein said second region is a p+ material, and wherein said RESURF region is a p− material.

5. An integrated circuit diode according to claim 1, wherein said substrate includes an isolation region made of said second type of semiconductor material, said portion of said substrate being disposed within said isolation region.

6. An integrated circuit diode according to claim 1, wherein said diode is a zener diode.

* * * * *